(12) United States Patent
Wang et al.

(10) Patent No.: US 11,594,284 B2
(45) Date of Patent: Feb. 28, 2023

(54) READ TIME OF THREE-DIMENSIONAL MEMORY DEVICE

(71) Applicant: Yangtze Memory Technologies Co., Ltd., Wuhan (CN)

(72) Inventors: Siyuan Wang, Wuhan (CN); Jin Yong Oh, Wuhan (CN); Yu Wang, Wuhan (CN); Ye Tian, Wuhan (CN); Zhichao Du, Wuhan (CN); Xiaojiang Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 30 days.

(21) Appl. No.: 17/212,416

(22) Filed: Mar. 25, 2021

(65) Prior Publication Data
US 2022/0254417 A1    Aug. 11, 2022

Related U.S. Application Data

(63) Continuation of application No. PCT/CN2021/076269, filed on Feb. 9, 2021.

(51) Int. Cl.
*G11C 16/04* (2006.01)
*G11C 16/26* (2006.01)
*G11C 16/08* (2006.01)
*G11C 16/24* (2006.01)
*H01L 27/11582* (2017.01)

(52) U.S. Cl.
CPC .......... *G11C 16/26* (2013.01); *G11C 16/0483* (2013.01); *G11C 16/08* (2013.01); *G11C 16/24* (2013.01); *H01L 27/11582* (2013.01)

(58) Field of Classification Search
CPC ..... G11C 16/26; G11C 16/0483; G11C 16/08; G11C 16/24
USPC ...................................................... 365/185.17
See application file for complete search history.

(56) References Cited

U.S. PATENT DOCUMENTS

| | | | |
|---|---|---|---|
| 7,016,230 B2* | 3/2006 | Hosono | G11C 16/344 365/185.21 |
| 8,179,720 B2* | 5/2012 | Fukuda | G11C 16/3436 365/185.23 |
| 9,281,058 B2* | 3/2016 | Lee | G11C 16/28 |

(Continued)

FOREIGN PATENT DOCUMENTS

| CN | 101388251 A | 3/2009 |
|---|---|---|
| CN | 103119655 A | 5/2013 |
| CN | 105469827 A | 4/2016 |

OTHER PUBLICATIONS

The World Intellectual Property Organization (WIPO) International Search Report for PCT/CN2021/076269 dated Nov. 9, 2021 4 pages.

*Primary Examiner* — Tha-O H Bui
(74) *Attorney, Agent, or Firm* — Anova Law Group, PLLC

(57) ABSTRACT

A method for operating a three-dimensional (3D) memory device includes performing a first read operation for sensing a first memory cell of a first transistor string, and performing a subsequent second read operation for sensing a second memory cell of a second transistor string. Performing the first read operation includes applying a first bit line voltage to a first bit line, and maintaining the first bit line basically undischarged after data state of the first memory cell is detected.

20 Claims, 11 Drawing Sheets

(56) References Cited

U.S. PATENT DOCUMENTS

| | | |
|---|---|---|
| 10,268,387 B2 | 4/2019 | Cr et al. |
| 10,529,431 B2 * | 1/2020 | Cho .................. G11C 16/08 |
| 10,861,536 B2 * | 12/2020 | Kamata ............ H01L 27/11556 |
| 2008/0225600 A1 | 9/2008 | Park et al. |
| 2010/0329031 A1 | 12/2010 | Lee et al. |

* cited by examiner

READ TIME OF THREE-DIMENSIONAL MEMORY DEVICE

CROSS-REFERENCE TO RELATED APPLICATION

This application claims the priority to PCT Patent Application No. PCT/CN2021/076269 filed on Feb. 9, 2021, the entire content of which is incorporated herein by reference.

FIELD OF THE TECHNOLOGY

This application relates to the field of semiconductor technology and, specifically, to a three-dimensional (3D) memory device and method of improving read time.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

Before a NAND memory cell is read during a read operation at a memory device, a bit line is charged to a certain voltage. The charging process can be affected by parasitic capacitance. For example, parasitic capacitance can cause the voltage level of a bit line to take a longer settling time. The longer settling time slows the read operation and leads to reduced performance of the memory device. The disclosed methods are directed to solve one or more problems set forth above and other problems.

SUMMARY

In one aspect of the present disclosure, a method for operating a three-dimensional (3D) memory device includes performing a first read operation for sensing a first memory cell of a first transistor string of a 3D memory array, and performing a subsequent second read operation for sensing a second memory cell of a second transistor string of the 3D memory array. Performing the first read operation includes applying a first bit line voltage to a first bit line, and maintaining the first bit line basically undischarged or partly discharging the first bit line from the first bit line voltage to a certain voltage after data state of the first memory cell is detected. The certain voltage is larger than half voltage level of the first bit line voltage.

In another aspect of the present disclosure, a 3D memory device includes memory cells in a 3D memory array, a page buffer for sensing data state of the memory cells of the memory array, and a controller for accessing the memory cells. The controller is configured to perform a first read operation for sensing a first memory cell of a first transistor string of the 3D memory array, and perform a subsequent second read operation for sensing a second memory cell of a second transistor string of the 3D memory array. Performing the first read operation includes applying a first bit line voltage to a first bit line, and maintaining the first bit line basically undischarged or partly discharging the first bit line from the first bit line voltage to a certain voltage after data state of the first memory cell is detected. The certain voltage is larger than half voltage level of the first bit line voltage.

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all of the embodiments of the present disclosure. Features in various embodiments may be exchanged and/or combined. Other embodiments obtained by a person skilled in the art based on the embodiments of the present disclosure without creative efforts shall fall within the scope of the present disclosure.

Figure 1:
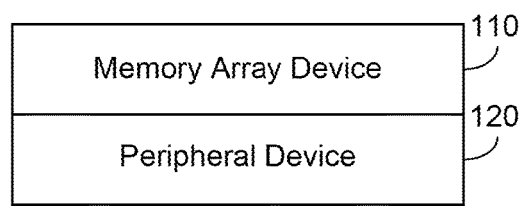
FIG. 1 illustrates a cross-sectional view of an exemplary three-dimensional (3D) memory device according to various embodiments of the present disclosure.

FIG. 1 schematically shows a cross-sectional view of an exemplary 3D memory device 100 according to embodiments of the present disclosure. The 3D memory device 100 may be a discrete memory device working individually. The 3D memory device 100 may also be a part of a memory structure that has multiple memory devices 100. The 3D memory device 100 may include a memory array device 110 and a peripheral device 120. The memory array device 110 may include memory cells that form one or more 3D arrays. The peripheral device 120 may include a circuitry as a controller to control operations of the 3D memory device 100. In some embodiments, the memory array device 110 and the peripheral device 120 may be fabricated separately and then bonded together to form a stack-like structure, as shown in FIG. 1. Alternatively, the memory array device 110 and the peripheral device 120 may be integrated into one device. For example, the peripheral device 120 may be fabricated first and then the memory array device 110 may be made over the peripheral device 120 and using the peripheral device 120 as a substrate. In some other embodiments, the memory array device 110 and the peripheral device 120 may be fabricated separated and then mounted side by side on a printed circuit board (PCB).

Figure 2:
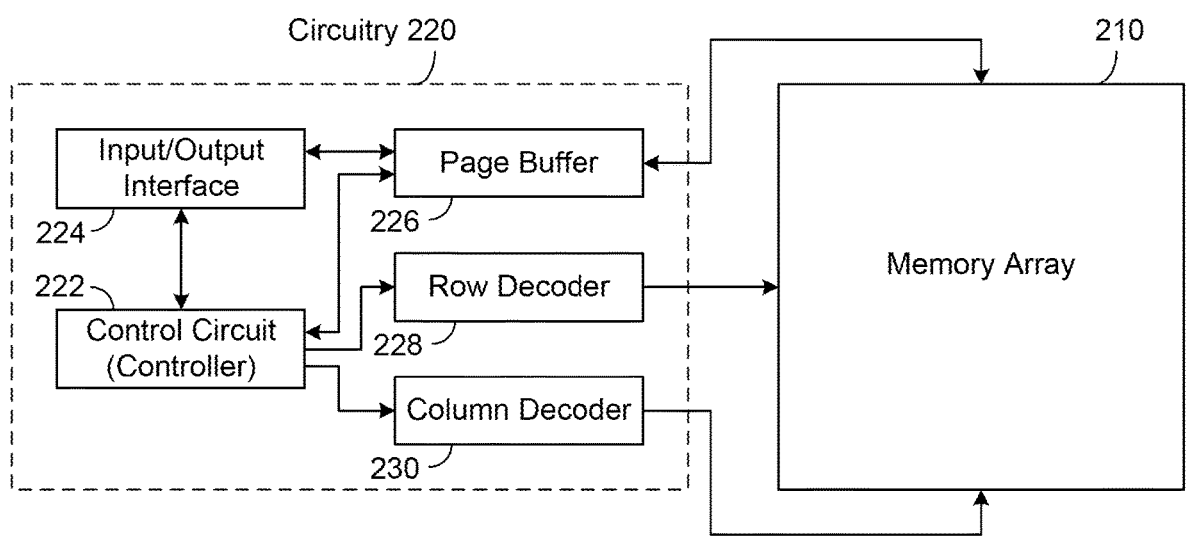
FIG. 2 illustrates a block diagram of a 3D memory device according to various embodiments of the present disclosure.

FIG. 2 shows a block diagram of a 3D memory device 200 according to embodiments of the present disclosure. The 3D memory device 200 may include a memory array 210 and a circuitry 220. The memory array 210 may include a 3D array of memory cells (not shown). The circuitry 220 may include a control circuit 222, an input/output (I/O) interface 224, a page buffer 226, a row decoder 228, and a column decoder 230. The control circuit 222 may function and be referred to as a controller that implements various functions of the 3D memory device 200. For example, the control circuit 222 may implement read operations, write operations, and erase operations. The I/O interface 224 may contain an I/O circuit to process input of commands, addresses, and data to the 3D memory device 200 and transmit data and status information from the 3D memory device 200 to another device. The row decoder 228 and column decoder 230 may decode row and column address signals respectively for accessing the memory array 210. The row decoder 228 and column decoder 230 may also receive different voltages from a voltage generator circuit (not shown) and transfer the received voltages to target objects, such as a word line or bit line. The page buffer 226 may temporarily store incoming or outgoing data when the data is transferred between the I/O interface 224 and the memory array 210 at write or read operations. Optionally, the page buffer 226 may contain certain sensing devices or sense amplifiers (not shown). The control circuit 222 may use the sensing devices or sense amplifiers to sense a data state of a memory cell of the memory array 210. A data state of a memory cell may be detected by sensing a state of a bit line connected to the memory cell. The term "connected" as used herein, indicates electrically connected. The verb "connect" as used herein indicates electrically connecting.

Figure 3:
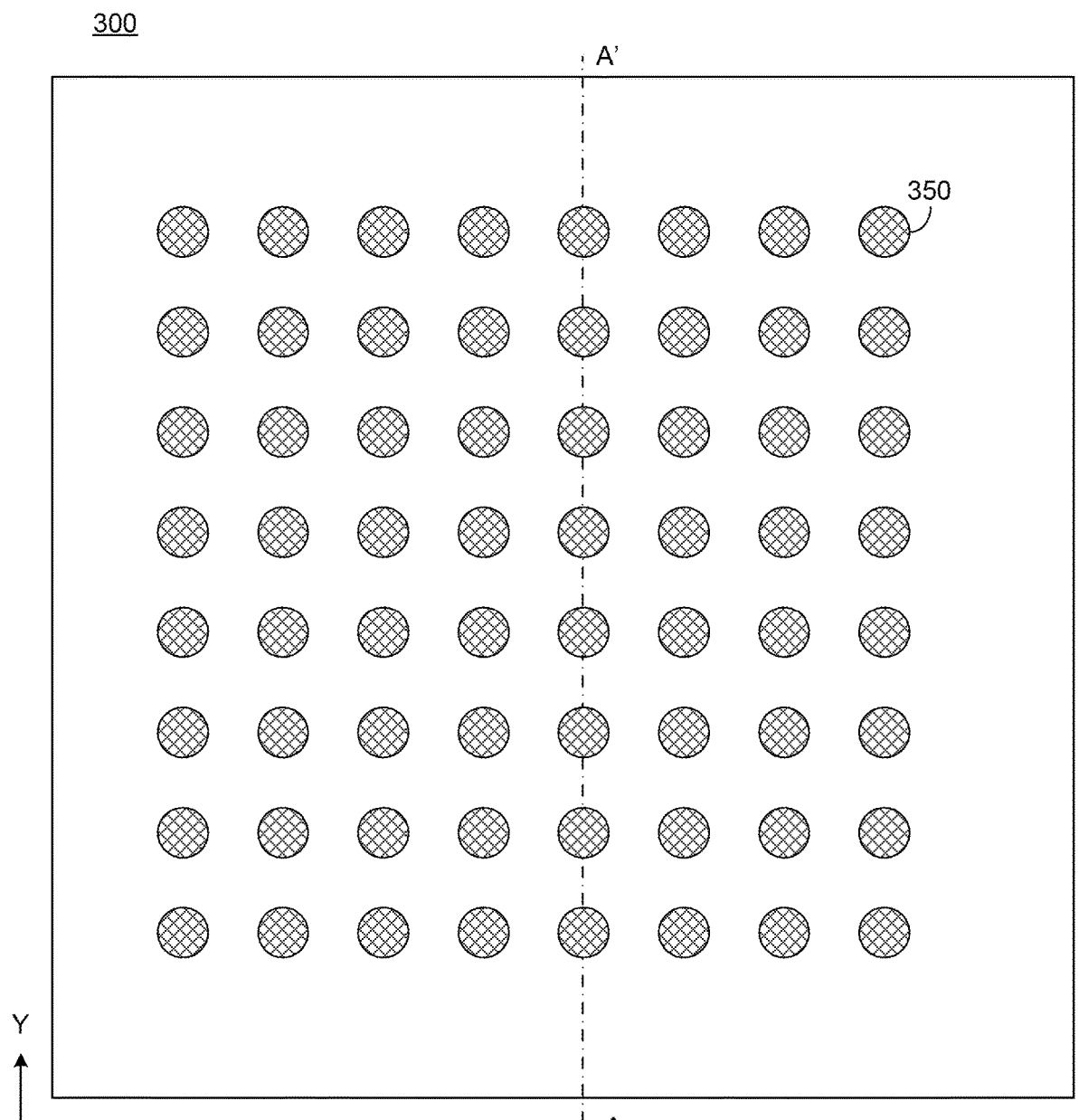
FIGS. 3 and 4 illustrate a top view and a cross-sectional view of a 3D array device at a certain stage in an exemplary fabrication process according to various embodiments of the present disclosure.
Figure 4:
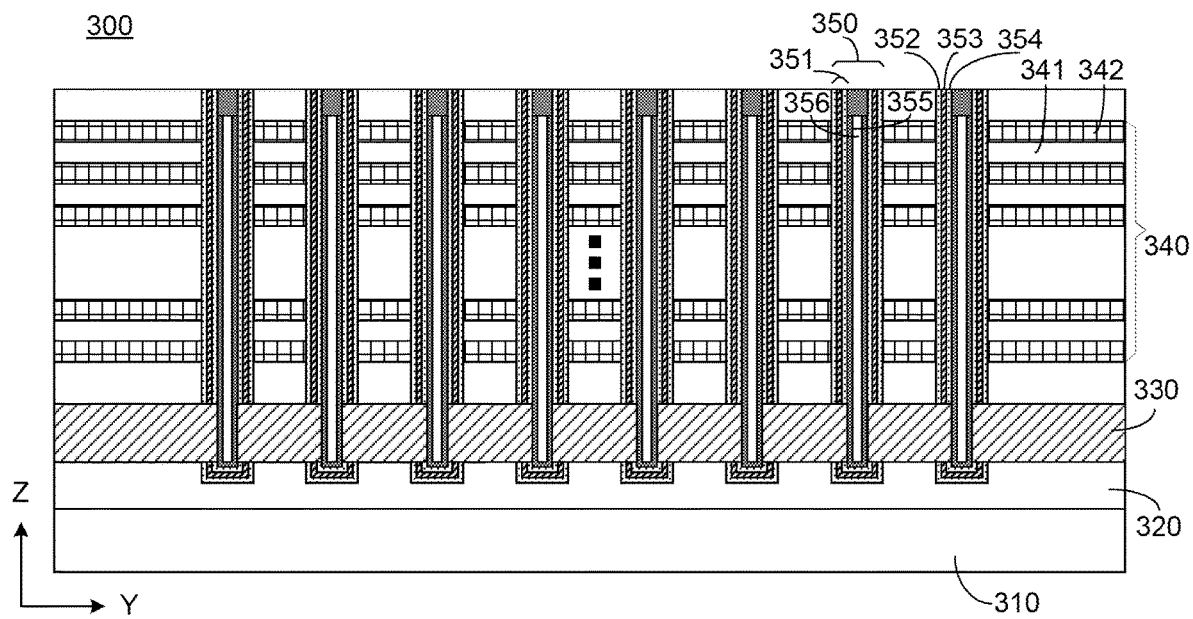

FIGS. 3 and 4 show a schematic top view and a schematic cross-sectional view of a 3D array device 300 at a certain stage in an exemplary fabrication process according to embodiments of the present disclosure. The 3D array device 300 is a part of a memory device. The top view is in an X-Y plane and the cross-sectional view is in a Y-Z plane. The cross-sectional view shown in FIG. 4 is taken along a line AA' of FIG. 3. As shown in FIG. 4, the 3D array device 300 may include a substrate 310, a doped region 320, and a semiconductor layer 330. The substrate 310 may include a semiconductor material, such as single crystalline silicon. In some embodiments, a top portion of the substrate 310 may be doped by n-type dopants via ion implantation and/or diffusion to form the doped region 320. The semiconductor layer 330 may be formed over the doped region 310 and may contain, e.g., n-doped polycrystalline silicon (polysilicon). Over the semiconductor layer 330, a layer stack 340 may be fabricated. The layer stack 340 may include dielectric layers 341 and conductor layers 342, stacked alternately over each other. The dielectric layer 341 may contain a dielectric material (e.g., silicon oxide) and the conductor layer 342 may contain a conductive material (e.g., tungsten (W)). The term "conductive", as used herein, indicates electrically conductive. The layer stack may include 64 pairs, 128 pairs, or more than 128 pairs of the dielectric layer 341 and conductor layer 342.

Referring to FIGS. 3 and 4, channel holes 350 are arranged to extend in the Z direction and form an array of a predetermined pattern in an X-Y plane. The channel holes 350 may have a cylinder shape or pillar shape that extends through the layer stack 340, the semiconductor layer 330, and partially penetrates the doped region 320. The quantity, dimension, and arrangement of the channel holes 350 shown in FIGS. 3 and 4 and in other figures in the present disclosure are exemplary and for description purposes, although any suitable quantity, dimension, and arrangement may be used for the disclosed 3D array device 300 according to various embodiments of the present disclosure.

Inside a channel hole 350, a functional layer 351 may be deposited. The functional layer 351 may include a blocking layer 352 on the sidewall and bottom of the channel hole to block an outflow of charges, a charge trap layer 353 on a surface of the blocking layer 352 to store charges during an operation of the 3D array device 300, and a tunnel insulation layer 354 on a surface of the charge trap layer 353. In some embodiments, the functional layer 351 may have an oxide-nitride-oxide (ONO) structure. That is, the blocking layer 352 may be a silicon oxide layer deposited on the sidewall of the channel hole 350, the charge trap layer 353 may be a silicon nitride layer deposited on the blocking layer 352, and the tunnel insulation layer 354 may be another silicon oxide layer deposited on the charge trap layer 353.

Over the tunnel insulation layer 354, a channel layer 355 may be deposited. The channel layer 355 is also referred to as a "semiconductor channel" and may include polysilicon in some embodiments. Like the channel holes, the channel layer 355 also extends through the layer stack 340 and into the doped region 320. The semiconductor layer 330 may be formed on the doped region 320 and on certain sidewalls or side portions of the channel layers 355, and connected to the doped region 320 and the channel layers 355. In some embodiments, the semiconductor layer 330 may be used as an array common source. The channel hole 350 may be filled by an oxide material 356 after the channel layer 355 is formed. The functional layer 351 and channel layer 355 formed in a channel hole 350 may be considered as a channel structure.

As shown in FIG. 4, a portion of each functional layer 351 in a channel hole 350 may be between a portion of a conductor layer 342 and a portion of a channel layer 355. Each conductor layer 342 may connect NAND memory cells in an X-Y plane and be configured as a word line of the 3D array device 300. The channel layer 355 formed in a channel hole 150 may be configured to connect a string of NAND memory cells along the Z direction. One end of the channel layer 355 may be connected to a bit line of the 3D array device 300. As such, a portion of the functional layer 351 in a channel hole 350 in an X-Y plane, as a part of a NAND memory cell, may be arranged between a conductor layer 342 and a channel layer 355, i.e., between a word line and a channel layer connected to a bit line. A NAND memory cell, including a portion of a conductor layer 342 that is around a portion of a channel hole 350, may be considered as a field-effect transistor with a control gate, a source, and a drain. A portion of a conductor layer 342 that is around a portion of a channel hole 350 may function as the control gate for the transistor. The 3D array device 300 may be considered as including a 2D array of strings of NAND memory cells (such a string is also referred to as a "NAND string"). Each NAND string may contain multiple NAND memory cells and extend vertically toward the substrate 310. The NAND strings may form a 3D array of the NAND memory cells. A NAND string may correspond to a transistor string that contains multiple field-effect transistors connected in series along a channel layer 355 in the Z direction. As such, the transistor strings may form a 3D array of the field-effect transistors.

Figure 5:
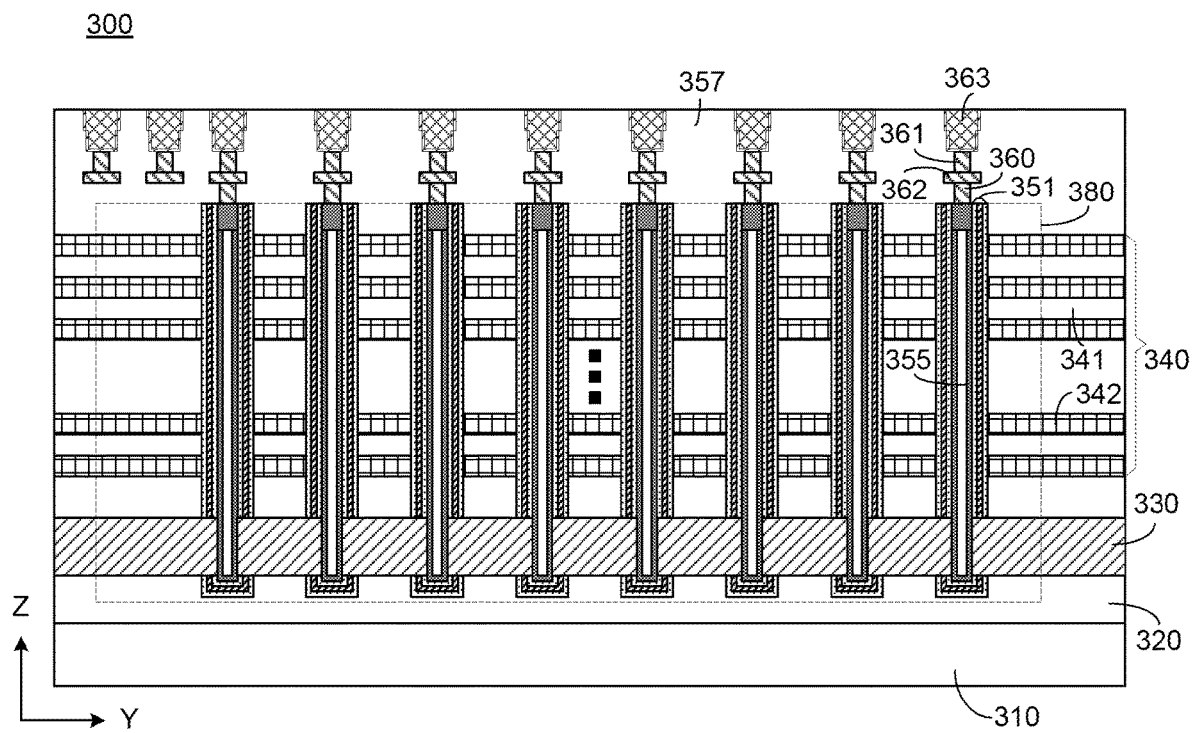
FIGS. 5 and 6 illustrate cross-sectional views of the 3D array device shown in FIGS. 3 and 4 at a certain stage in the exemplary fabrication process according to various embodiments of the present disclosure.
Figure 6:
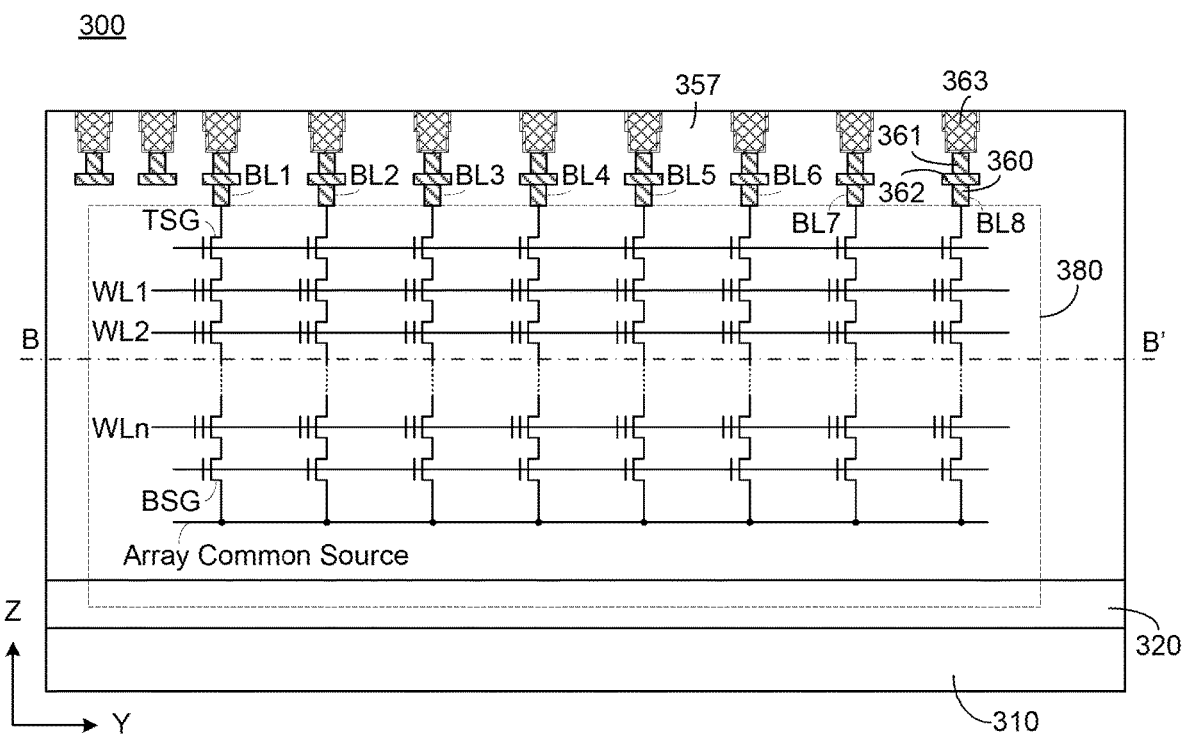

FIGS. 5 and 6 show schematic cross-sectional views of the 3D array device 300 at a certain stage in the exemplary fabrication process according to embodiments of the present disclosure. As shown in FIG. 5, a dielectric layer 357 may be deposited over the layer stack 340 and the channel holes 350. Further, vias 360 and 361 and conductive layers 362 may be formed for interconnect in the dielectric layer 357. For example, some of the vias 360 may be connected to the channel layers 355. Thereafter, a dielectric material may be deposited to make the dielectric layer 357 thicker and connecting pads 363 may be formed over and connected to the vias 361. Some connecting pads 363 may be connected with the channel layers 355 through the vias 361-362 and the conductive layers 363. A conductive material (e.g., W) may be used to fabricate the vias 360-361, conductive layers 362, and connecting pads 363.

The channel structures and conductor layers 342 as shown in the cross-sectional view in FIG. 5 may represent a memory block 380 of the 3D array device 300. The memory block 380, whose boundary is depicted by dashed lines in FIG. 5, may contain multiple NAND strings or transistor strings. The field-effect transistors and electrical circuit of the memory block 380 is illustrated in FIG. 6 schematically, where a circuit diagram replaces the diagram of the channel structures and the layer stack 340. As shown in FIG. 6, each NAND memory cell is replaced by a field-effect transistor. The channel layers 355 are connected to bit lines BL1-BL8 (e.g., the vias 360), respectively. The field-effect transistor whose drain is connected to a bit line may be configured as a select transistor and referred to as a top select gate (TSG). The field-effect transistor whose source is connected to the array common source may also be configured as a select transistor and referred to as a bottom select gate (BSG). The control gates of the TSGs may be connected to a select line (e.g., a conductor layer 342), while the control gates of the BSGs may be connected to another select line (e.g., another conductor layer 342). The word lines WL1-WLn may correspond to conductor layers 342 between the TSGs and BSGs.

The 3D array device 300 may contain rows and columns of the NAND memory cells. NAND memory cells (or field-effect transistors) whose control gates are connected to a conductor layer 342 (i.e., a word line) may form a row. NAND memory cells (or field-effect transistors) connected to a channel layer 355 that is connected with a bit line may form a column. Thus, the NAND memory cells whose control gates are connected to a conductor layer 342 (or a word line) as shown in FIG. 5 or 6 only represent a portion of NAND memory cells that belong to a row.

Figure 7:
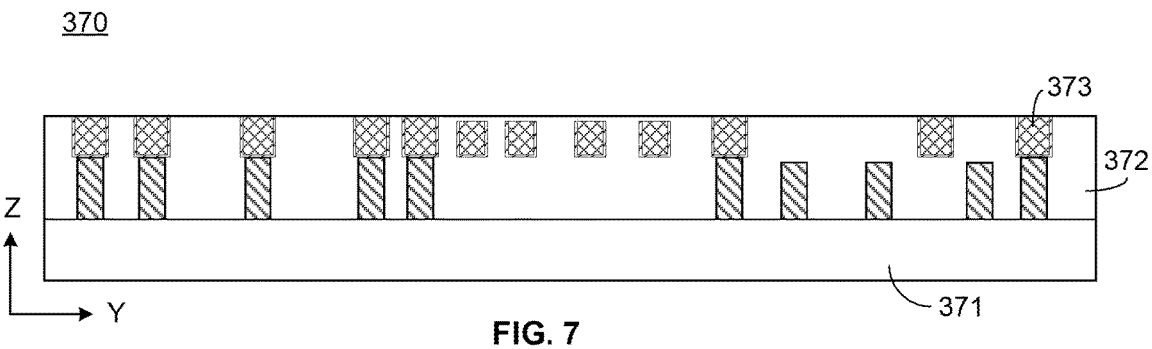
FIG. 7 illustrates a cross-sectional view of an exemplary peripheral device according to various embodiments of the present disclosure.

FIG. 7 shows a schematic cross-sectional view of a peripheral device 370 according to embodiments of the present disclosure. The peripheral device 370 may include a semiconductor substrate 371 such as single crystalline silicon. A control circuitry (e.g., the control circuit 222 with reference to FIG. 2) may be fabricated on the substrate 371 and used for facilitating the operation of a 3D memory device. A dielectric layer 372 may be deposited over the substrate 371 and the control circuitry. Connecting pads such as connecting pads 373 and vias may be formed in the dielectric layer 372. The connecting pads 373 may be configured for connection with the 3D array device 300 and contain a conductive material such as W.

Figure 8:
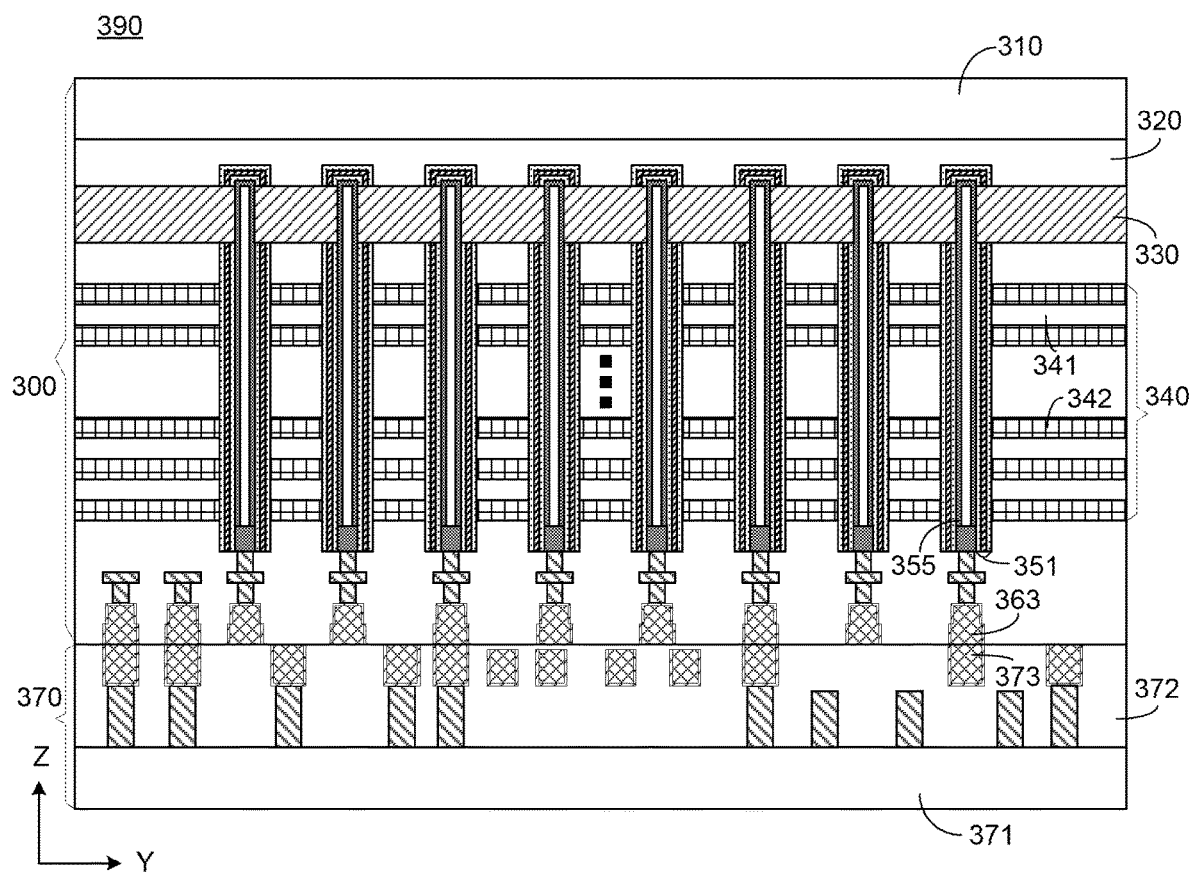
FIG. 8 illustrates a cross-sectional view of an exemplary 3D memory device after the 3D array device shown in FIGS. 5 and 6 is bonded with the peripheral device shown in FIG. 7 according to various embodiments of the present disclosure.

FIG. 8 schematically shows an exemplary 3D memory device 390 at a certain fabrication stage according to embodiments of the present disclosure. The 3D memory device 390 may include the 3D array device 300 shown in FIG. 5 and the peripheral device 370 shown in FIG. 7. The peripheral device 370 is configured to control the array device 300 or the 3D memory device 390.

The 3D array device 300 and peripheral device 370 may be bonded by a flip-chip bonding method to form the 3D memory device 390, as shown in FIG. 8. For the 3D array device 300 and peripheral device 370, the bottom side of the substrate 310 or 371 may be referred to as the back side, and the side with the connecting pads 363 or 373 may be referred to as the front side or face side. After the flip-chip bonding process, the connecting pads 363 are bonded with the connecting pads 373, respectively. That is, the 3D array device 300 and peripheral device 370 are bonded face to face and in electrical communication.

Thereafter, other fabrication steps or processes may be performed to complete fabrication of the 3D memory device 390. Details of the other fabrication steps or processes are omitted for simplicity.

Figure 9:
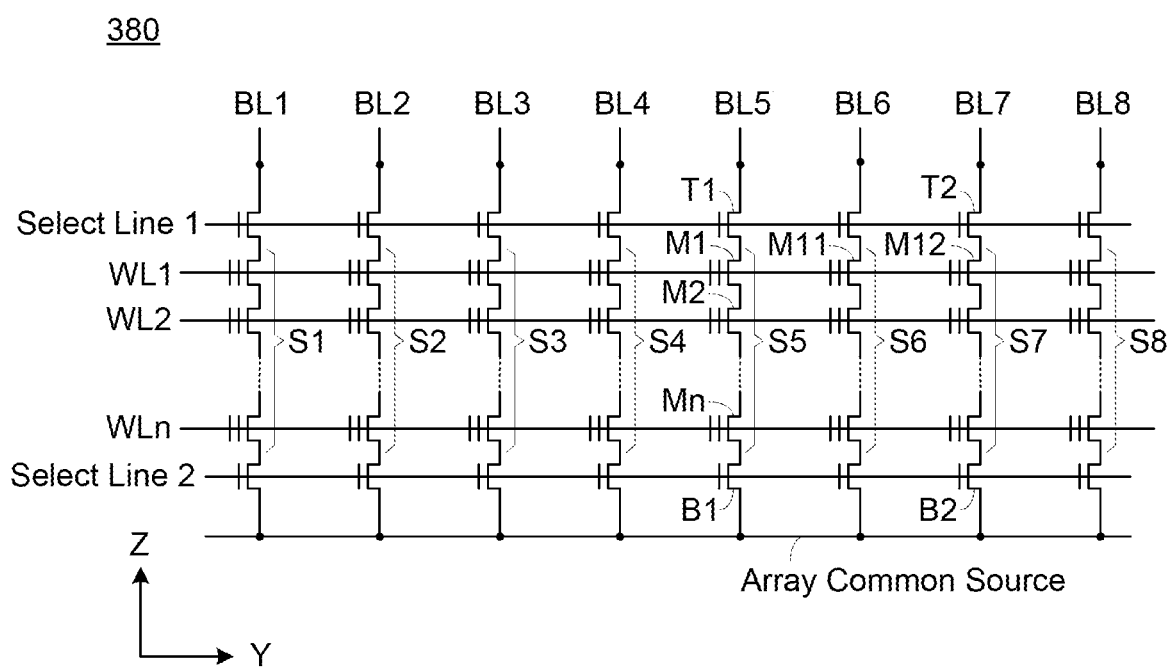
FIG. 9 illustrates a circuit diagram of a memory block of the 3D memory device shown in FIG. 6 according to various embodiments of the present disclosure.

FIG. 9 schematically shows the circuit diagram of the memory block 380 in more detail according to embodiments of the present disclosure. Assuming that transistor strings S1-S8 correspond to the bit lines BL1-BL8, respectively. The transistor string S5 may include field-effect transistors (i.e., NAND memory cells) M1-Mn. Field-effect transistors M11 and M12 are with the transistor strings S6 and S7, respectively. The TSGs of the memory block 380 may be connected with a select line 1, while the BSGs of the memory block 380 may be connected with a select line 2. Each transistor string may include field-effect transistors (i.e., NAND memory cells) connected in series along the string in the Z direction. For example, the transistor string S5 may include field-effect transistors (i.e., NAND memory cells) M1 to Mn connected in series. When a certain voltage is applied to select line 1, the TSGs of the memory block 380 may be turned on. When a certain voltage is applied to select line 2, the BSGs of the memory block 380 may be turned on. Voltage levels applied to a word line, a bit line, the select line 1, and the select line 2 may be used to select an NAND memory cell at a read operation or write (i.e., programming) operation. The voltage level of a bit line may also be used to detect an NAND memory cell at a read operation. The read operations and write operations may be implemented by a controller such as the control circuit 222 with reference to FIG. 2.

For example at a read operation, the voltage of the bit line BL5 may be sensed to determine a data state of the memory cell M1. In some cases, the bit line BL5 is charged first.

After the voltage of the bit line BL5 is settled, the voltage of the word line WL1 that is coupled to the memory cell M1 is raised to cause the memory cell M1 to generate a current based on the data state of the memory cell M1. A relatively large current that pulls down the voltage of the bit line BL5 indicates that the memory cell M1 is not programmed. A relatively small current, which does not affect the voltage of the bit line BL5 significantly, indicates that the memory cell M1 is programmed.

Because bit lines have parasitic capacitors, the settling time of a bit line may be affected and the total reading time may be increased. In addition, since the capacitive characteristics of a bit line are dependent on manufacturing processes and the circuitry configuration, the settling time required by different memory cells may be different. In consequence, a worst case settling time is often applied to ensure the sensing accuracy at a read operation and the read time may be further affected.

When the NAND memory cell M1 is read at a read operation, for example, certain voltages may be applied to the bit line BL5 and word line WL1. BL5 and WL1 may be referred to as the selected bit line and selected word line, while the remaining bit lines (e.g., BL1-BL4 and BL6-BL8) and remaining word lines (e.g., WL2-WLn) may be referred to as the unselected bit lines and unselected word lines, respectively. Further, certain voltages may also be applied to the select lines 1 and 2 to turn on the TSG T1 and BSG B1, respectively. As such, the two ends of the string S5 are connected to the bit line BL5 and the array common source, respectively. The data stored at NAND memory cell M1 may be detected by sensing the data state of the bit line BL5 via a sensing device or sensing component that may include a sensing circuit.

Similarly, when the NAND memory cell M12 is read at a read operation, certain voltages may be applied to the bit line BL7 and word line WL1, i.e., the selected bit line and selected word line. Further, certain voltages may also be applied to the select lines 1 and 2 to turn on the TSG T2 and BSG B2, respectively. As such, the two ends of the string S7 are connected to the bit line BL7 and the array common source, respectively. The data stored at NAND memory cell M12 may be detected by sensing the data state of the bit line BL7 via a sensing device or sensing component.

In some embodiments, the voltage level of a selected bit line is lower than that of the unselected bit lines at a read operation. When the NAND memory cell M1 is accessed at a read operation, for example, the voltage level of the bit line BL5 may be arranged lower than that of the bit lines BL1-BL4 and BL6-BL8. In some cases, the bit line BL5 may be discharged and the voltage level of the bit line BL5 may be reduced to the ground voltage after the NAND memory cell M1 is read, and then the voltage level of the bit line BL6 may be lowered to a certain value if the NAND memory cell M11 is to be accessed at a subsequent read operation.

In some embodiments, however, after the NAND memory cell M1 is read, the bit line BL5 may not be discharged or be basically undischarged. As such, the voltage level of the bit line BL5 may be maintained at the same value. Alternatively, the voltage level of the bit line BL5 may be maintained at a similar value after the NAND memory cell M1 is read. That is, the change of the voltage level of the bit line BL5 may be maintained substantially small, e.g., the change may be within ten percent, after the NAND memory cell M1 is read. Optionally, the voltage level of the bit line BL5 may be partly discharged after the NAND memory cell M1 is read. For example, after the NAND memory cell M1 is read, the voltage level of the bit line BL5 may be partly discharged from a first voltage value to a second voltage value, where the second voltage value is larger than half the first voltage value.

Assuming that the NAND memory cells M1 and M11 are read consecutively. When the NAND memory cell M1 is read at a first read operation, a first voltage may be applied to the bit line BL5 and a second voltage that is higher than the first voltage may be applied to the bit line BL6. After the NAND memory cell M1 is read by a sensing device, the first voltage may be maintained at the bit line BL5 and at the same time, the voltage level of the bit line BL6 may be reduced from the second voltage to a certain value (e.g., the first voltage) at a second read operation. Then, the NAND memory cell M11 may be read by a sensing device.

If the bit line BL5 is discharged to the ground voltage after the first read operation in a first scenario, assume that there exists first parasitic capacitance between bit lines BL5 and BL6 when the voltage of the bit line BL6 is lowered from the second voltage to the certain value (e.g., the first voltage). If the bit line BL5 is not discharged and maintains the first voltage after the first read operation in a second scenario, assume that there exists second parasitic capacitance between bit lines BL5 and BL6 when the voltage of the bit line BL6 is lowered from the second voltage to the certain value (e.g., the first voltage). Because the voltage difference between the bit lines BL5 and BL6 in the second scenario is smaller than that in the first scenario, the second parasitic capacitance may be smaller than the first parasitic capacitance. Therefore, since the bit line BL5 is not discharged and maintains the first voltage after the first operation, the parasitic capacitance may be reduced and the settling time of the bit line BL6 when reaching the voltage level of the certain value may be improved. As such, the read time of the worst case and then the read time of the NAND memory cells may be improved.

Further, when the NAND memory cells M1 and M12 are read consecutively, the NAND memory cell M1 is read at a first read operation and the NAND memory cell M12 is read at a second read operation. The NAND memory cells M1 and M12 are separated by the NAND memory cells M11 and the transistor strings S5 and S7 are separated by the transistor string S6. The first voltage may be applied to the bit line BL5 and the second voltage may be applied to the bit line BL7. After the NAND memory cell M1 is read by a sensing device, the first voltage may be maintained at the bit line BL5. At the same time, the voltage level of the bit line BL7 may be reduced from the second voltage to a certain value (e.g., the first voltage or a value substantially close to the first voltage) at a second read operation. Then, the NAND memory cell M12 may be read by a sensing device. Because the voltage difference between the bit lines BL5 and BL7 is smaller when the bit line BL5 is not discharged and maintains the first voltage than that when the bit line BL5 is discharged to the ground level, the parasitic capacitance between the bit lines BL5 and BL7 may be reduced and the settling time of the bit line BL7 may be improved. Hence, the read time of the worst case and then the read time of the NAND memory cells may be improved.

Figure 10:
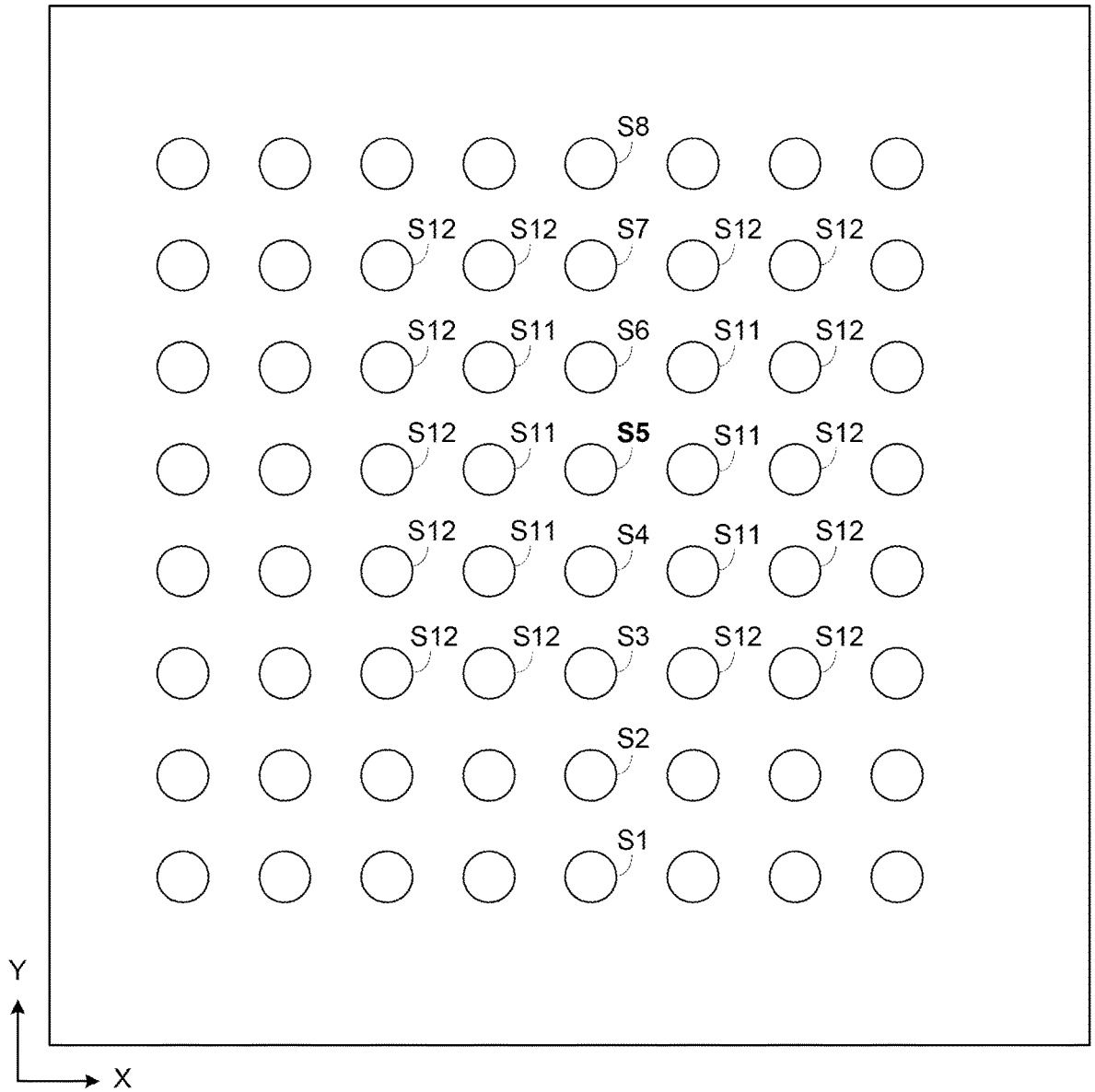
FIG. 10 illustrates a cross-sectional view of the exemplary 3D memory device shown in FIGS. 5 and 6 according to various embodiments of the present disclosure.

FIG. 10 shows a cross-sectional view of the 3D array device 300 shown in FIGS. 5 and 6 according to various embodiments of the present disclosure. The cross-sectional view shown in FIG. 10 is in an X-Y plane and taken along a line BB' of FIG. 6. An array of transistor strings or NAND strings is shown in FIG. 10 schematically. The transistor strings may include strings S1-S8, strings S11, and strings S12. The transistor strings S4, S6, and S11 are adjacent to and surround the transistor string S5. The transistor strings S3, S7, and S12 are adjacent to and surround the transistor strings S4, S6, and S11. The transistor strings S4, S6, and S11, disposed between the transistor string S5 and the transistor strings S3, S7, and S12 respectively, may be referred to as the middle strings. As illustrated above, after the NAND memory cell M1, which is on the transistor string S5, is read at a first read operation, the bit line BL5, which is connected to the transistor string S5, may maintain a certain voltage and not be discharge. The bit line BL5 may keep the voltage level around the certain voltage when a second read operation begins to sense the NAND memory cell M11, which is on the transistor string S6. The bit line BL5 may also keep the voltage level around the certain voltage when a second read operation begins to sense the NAND memory cell M12, which is on the transistor string S7. As illustrated above, the merits of keeping the voltage level of the bit line BL5 around the certain voltage include improved worst case settling time and shortened read time at a read operation.

Further, in some embodiments, after the NAND memory cell M1 of the transistor string S5 is read at a first read operation, the bit line BL5 may maintain a certain voltage and not be discharged before and after a second read operation begins. The second read operation may sense a select NAND memory cell that is on one of the transistor strings S6-S7, S3-S4, S11, and S12. Hence, after a first NAND memory cell of a first transistor string connected to a first bit line is read at a first read operation, the voltage level of the first bit line may remain the same or a similar value and not be reduced to the ground voltage by discharge before and after a second read operation begins. The second read operation may sense a second NAND memory cell of a second transistor string, where the second transistor string may be adjacent to the first transistor string or the second transistor string may be adjacent to a middle transistor string that is adjacent to the first transistor string.

Optionally, after a first NAND memory cell of a first transistor string connected to a first bit line is read at a first read operation, a first voltage level of the first bit line may remain the same or a similar value and not be reduced to the ground voltage by discharge before and after a second read operation begins. Assuming that the first NAND memory cell is from a row. A second voltage level may be applied to bit lines of the row but the first bit line at the first read operation. The second read operation may sense a second NAND memory cell of a second transistor string connected to a second bit line, where the second transistor string may have at least one NAND memory cell in the row. That is, the first transistor string and the second transistor string each may have at least one NAND memory cell that is in the row.

In some embodiments, NAND memory cells of a row may be divided into pages of memory cells. For example, NAND memory cells of a row that are connected to certain bit lines may form a page, while NAND memory cells of the row that are connected to certain other bit lines may form another page. Optionally, after a first NAND memory cell of a first transistor string connected to a first bit line is read at a first read operation, the voltage level of the first bit line may remain the same or a similar value and not be reduced to the ground voltage by discharge before and after a second read operation begins. Assuming that the first NAND memory cell is from a page. A second voltage level is applied to bit lines of the page but the first bit line at the first read operation. The second read operation may sense a second NAND memory cell of a second transistor string connected to a second bit line, where the second transistor string may have at least one NAND memory cell from the page. That is, the first transistor string and the second transistor string each may have at least one NAND memory cell that is from the page.

Figure 11:
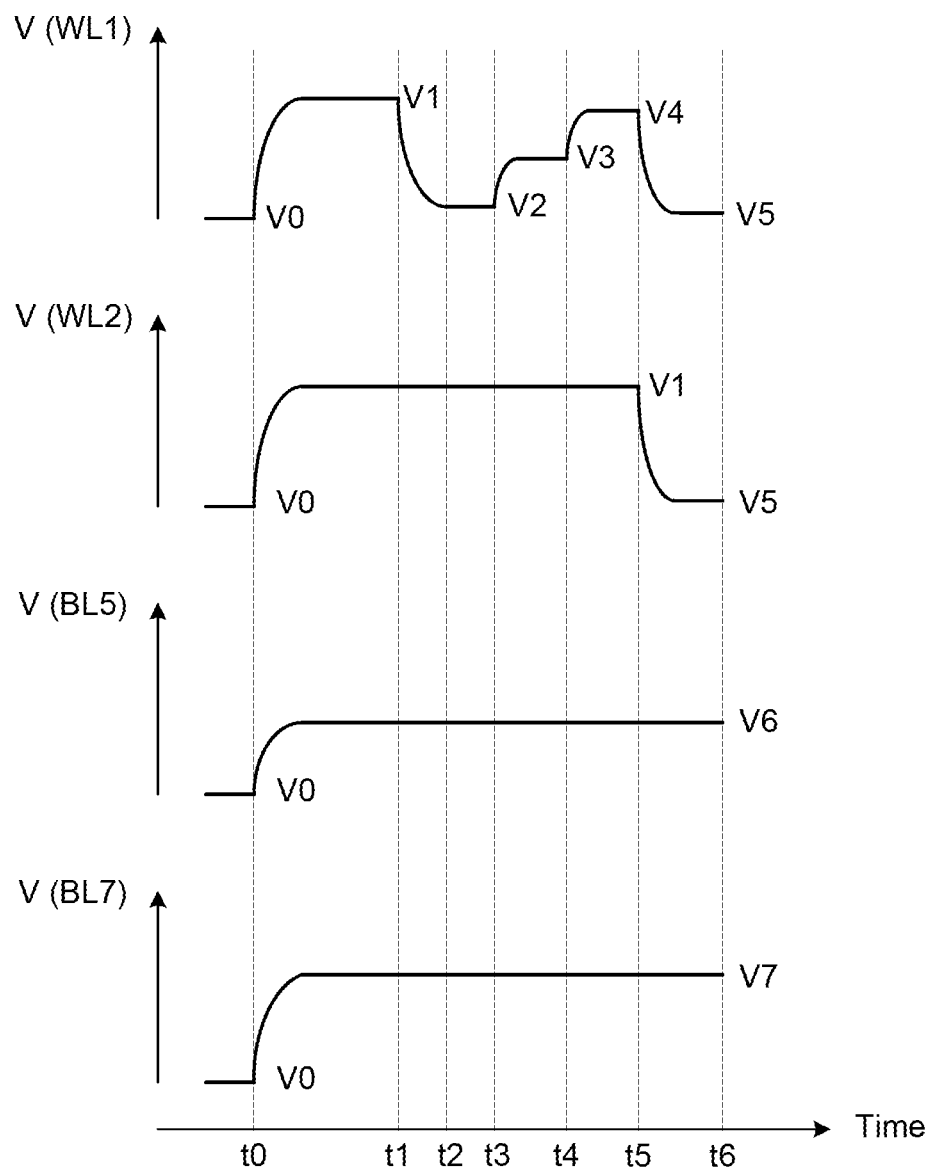
FIG. 11 illustrates timing diagrams of an exemplary read operation for a 3D memory device according to various embodiments of the present disclosure.

FIG. 11 shows timing diagrams of an exemplary read operation for the 3D memory device 390 according to various embodiments of the present disclosure. Assuming that the NAND memory cells M1 and M12, with reference to FIG. 9, are accessed at a first read operation and a second read operation consecutively by a controller (e.g., the control circuit 222 with reference to FIG. 2) of the 3D memory device 390. The controller may implement certain commands to apply a voltage to or discharge a word lines or bit line. The timing diagrams display schematically traces of the word lines WL1 and WL2 and the bit lines BL5 and BL7 during the first read operation. At time t0, a voltage V1 is applied to word line WL1 by the controller. The voltage level of the word line WL1 is increased from V0 to V1. V0 may be a reference potential (e.g., the ground). At time t1, the voltage level of the word line WL1 may be discharged and reduced to V2 at time t2. The voltage V2 may be the ground voltage or a read voltage arranged to read the data state of the NAND memory cell M1. In the latter case, the controller may perform a sensing process. If the NAND memory cell M1 is activated (e.g., a target value is detected), the data state may be that corresponding to a threshold of V2. If the target value is not sensed, the data state may be that corresponding to a threshold higher than V2.

At time t3, a voltage V3 is applied to the word line WL1 by the controller. The voltage V3 may be a read voltage arranged to read the data state of the NAND memory cell M1. A sensing process operated by the controller may begin after the voltage level of the word line WL1 reaches V3 between time t3 and t4. If the NAND memory cell M1 is activated (e.g., a target value is detected), the data state may be that corresponding to a threshold of V3. If the target value is not sensed, the data state may be that corresponding to a threshold higher than V3.

At time t4, a voltage V4 is applied to the word line WL1 by the controller. The voltage V4 may be a read voltage arranged to read the data state of the NAND memory cell M1. A sensing process may begin after the voltage level of WL1 reaches V4 between time t4 and t5. If the NAND memory cell M1 is activated (e.g., a target value is detected), the data state may be that corresponding to a threshold of V4. At time t5, the word line WL1 is discharged. The voltage level of the word line WL1 may be discharged to V5 (e.g., a reference level or the ground). At time t6, the first read operation may be concluded, and the second read operation may get started at time t6 or shortly after time t6.

The trace of voltage level of the word line WL2 shows that at time t0, a charging process gets started. The voltage level of the word line WL2 may be charged to voltage V1. At time t5, the word line WL2 may be discharged to V5 by the controller. At time t6, the voltage level of the word line WL2 may remain at V5.

The trace of voltage level of the bit line BL7 shows that at time t0, a charging process gets started. The voltage level of BL7 may be charged to a predetermined voltage V7. The bit line BL7 may maintain the voltage V7 between time t1 and t6 and before the second read operation begins.

The trace of voltage level of the bit line BL5 which the NAND memory cell M1 is connected to shows that at time t0, a charging process gets started. The voltage level of the bit line BL5 may be charged to a predetermined voltage V6. V6 may be smaller than V7 in some embodiments. The bit line BL5 may maintain the voltage V6 between time t1 and t6 and before/after the second read operation begins. Because the bit line BL5 is not discharged to V5 and instead, maintains the voltage V6, when the NAND memory cell M12 is read in the second read operation, the parasitic capacitance between the bit lines BL5 and BL7 may be reduced and the settling time of the bit line BL7 when the voltage level of BL7 is lowered from V7 to a certain value (e.g., V6) may be improved. As such, the read time of the worst case and then the read time of the 3D memory device may be improved.

Figure 12:
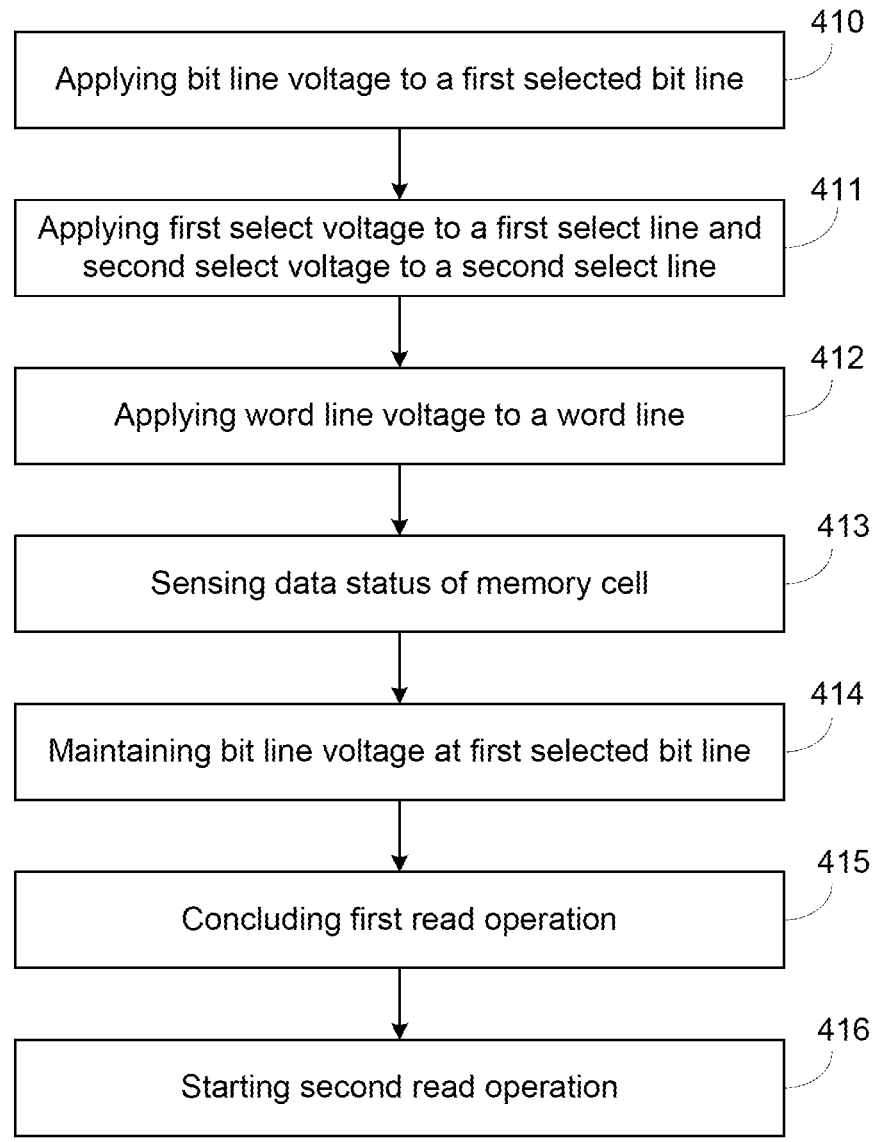
FIG. 12 illustrates a schematic flow chart illustrating methods of performing a read operation at a 3D memory device according to various aspects of the present disclosure.

FIG. 12 shows a schematic flow chart 400 for describing methods of performing a read operation at a 3D memory device according to embodiments of the present disclosure. The read operation may be performed by a controller (e.g., the control circuit 222 with reference to FIG. 2) of the 3D memory device. At a first read operation, a first selected memory cell of a first transistor string is sensed by the controller. At a second read operation, a second selected memory cell of a second transistor string is sensed by the controller. The first transistor string corresponds to a first selected bit line, while the second transistor string corresponds to a second selected bit line.

At 410, a bit line voltage is applied to the first selected bit line and a certain voltage higher than the bit line voltage is applied to the second selected bit line and certain unselected bit lines by the controller. In some embodiments, the second transistor string may be adjacent to the first transistor string. Optionally, the second transistor string may be adjacent to a middle transistor string that is adjacent to the first transistor string. In some other embodiments, the first and second transistor strings each may have at least one memory cell that is from a same page or same row. At 411, a first select voltage is applied to a first select line to turn on certain selected TSGs and a second select voltage is applied to a second select line to turn on certain selected BSGs by the controller. Then one end of the first transistor string is connected to the first selected bit line, while the other end of the first transistor string is connected to a common source. At 412, a word line voltage is applied to a selected word line by the controller. That is, the word line voltage is applied to the control gate of the first selected memory cell. At 413, a sensing device such as a sensing amplifier connected to the first selected bit line is used by the controller to sense the data state of the first selected memory cell at a sensing operation. After the sensing operation, the first selected bit line is not discharged to the ground level at 414, for example, the bit line voltage is maintained at the first selected bit line or a voltage close to the bit line voltage is maintained at the first selected bit line by the controller. At 415, the first read operation is concluded by the controller and the second read operation begins at 416. In some embodiments, the bit line voltage is still maintained at the first selected bit line or a voltage close to the bit line voltage is still maintained at the first selected bit line by the controller. Then, the second selected memory cell is sensed by the controller via a sensing device.

Because the first selected bit line is not discharged to the ground level before and after the second read operation begins, the parasitic capacitance between the first selected bit line and the second selected bit line may be reduced and the settling time of the second selected bit line may be improved. Hence, the method may reduce the read time of the worst case and then improve the read time of the 3D memory device.

Figure 13:
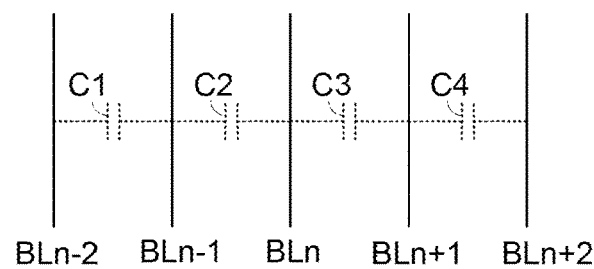
FIG. 13 illustrates an exemplary bit line arrangement of a 3D memory device according to various embodiments of the present disclosure.

FIG. 13 schematically shows a bit line arrangement 500 according to embodiments of the present disclosure. The bit line arrangement 500 may include bit lines BLn, BLn±1, and BLn±2, reflecting a part of a structure of a 3D memory device. There are four parasitic capacitors C, C2, C3, and C4 between the adjacent bit lines. There are also parasitic capacitors (not shown) between bit lines that are not adjacent. For example, there are parasitic capacitors C1 and C2 between adjacent bit lines BLn−1 and BLn−2 and adjacent bit lines BLn−1 and BLn, while there is also a parasitic capacitor between bit lines BLn−2 and BLn that are not adjacent and separated by the bit line BLn−1. Since the voltage difference of two bit lines influences the capacitance between them, the voltage level of a bit line (e.g., BLn−2) not only affects a charging or discharging process of an adjacent bit line (e.g., BLn−1), but also a bit line (e.g., BLn) that is separated by the adjacent bit line.

Figure 14:
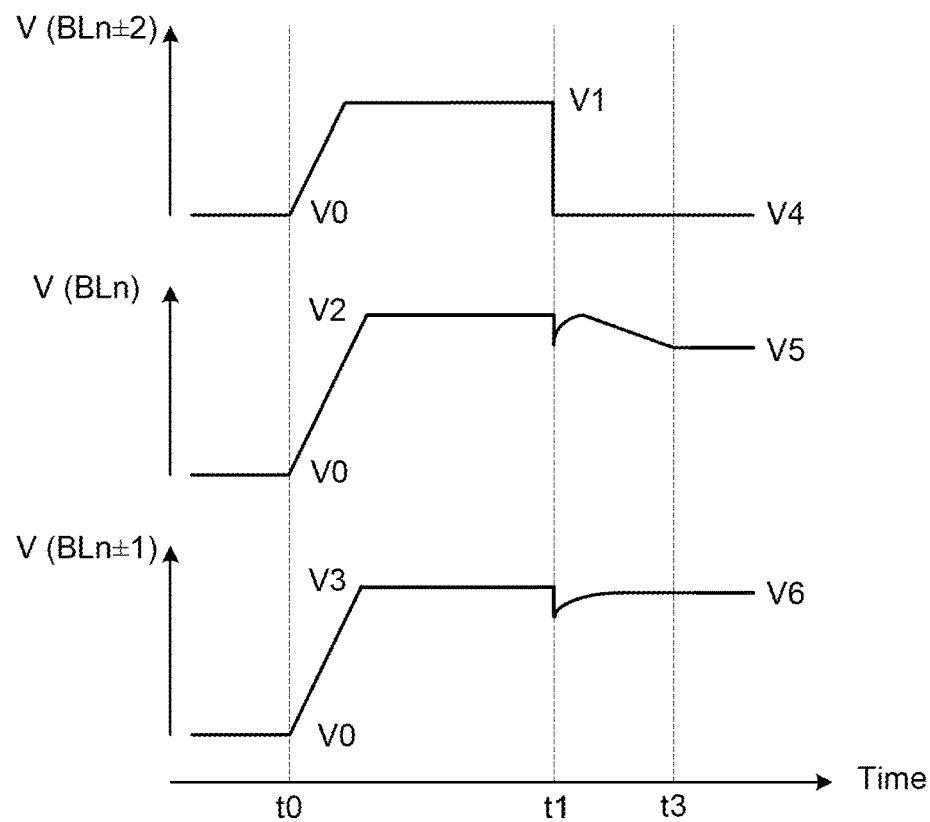
FIGS. 14 and 15 illustrate timing diagrams of an exemplary read operation based on the bit line arrangement shown in FIG. 13.
Figure 15:
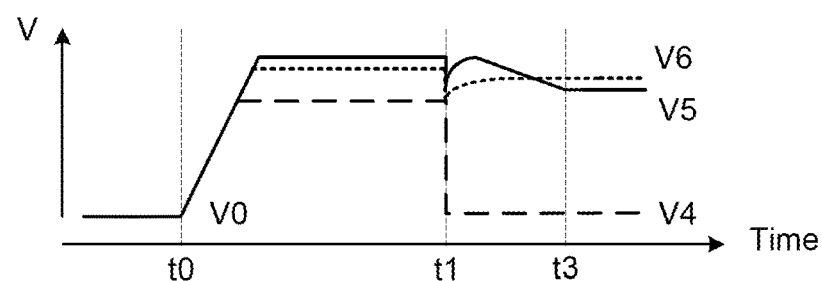

FIGS. 14 and 15 show timing diagrams related to the read operation based on the bit line arrangement 500 shown in FIG. 13. The timing diagrams display schematically voltage traces of the bit lines BLn±2, BLn, and BLn±1 during first and second read operations in some cases. Voltage traces of other lines such as word lines are omitted. FIG. 14 shows the voltage traces individually, while FIG. 15 shows the voltage traces superimposed on each other. In FIG. 15, the voltage traces of the bit lines BLn±2, BLn, and BLn±1 are in a dashed line, a solid line, and a dotted line, respectively. Referring to FIG. 14, before time t0, the voltage of the bit lines is V0 (e.g., a reference potential or the ground). At time t0, the first read operation begins and a voltage V1 is applied to the selected bit line BLn+2 or BLn−2. After the voltage level of the bit line BLn+2 or BLn−2 is charged to V1, a selected memory cell may be accessed and read. At time t1, the first read operation is concluded and the selected bit line BLn+2 or BLn−2 is discharged to a voltage V4 (e.g., a reference potential or the ground).

During the first read operation, a voltage V2 is applied to the unselected bit line BLn at t0. The unselected bit line BLn becomes the selected bit line at the subsequent second read operation that begins at time t1. At time t1, the selected bit line BLn is discharged to V5. Due to the parasitic capacitance, the voltage of the selected bit line BLn is not settled until time t3. After time t3, a selected memory cell may be accessed and read for the second read operation.

When the unselected bit line BLn is charged to V2 at the first read operation, the unselected bit line BLn+1 or BLn−1 is charged to V3. In some embodiments, the voltage V1 is smaller than V3 and the voltage V3 is smaller than V2. After time t1, the voltage level of the unselected bit line BLn+1 or BLn−1 is influenced by the discharge of the bit line BLn+2 or BLn−2 and the discharge of the bit line BLn, which may lower the voltage level of the bit line BLn+1 or BLn−1 to fall and reach a voltage V6.

Figure 16:
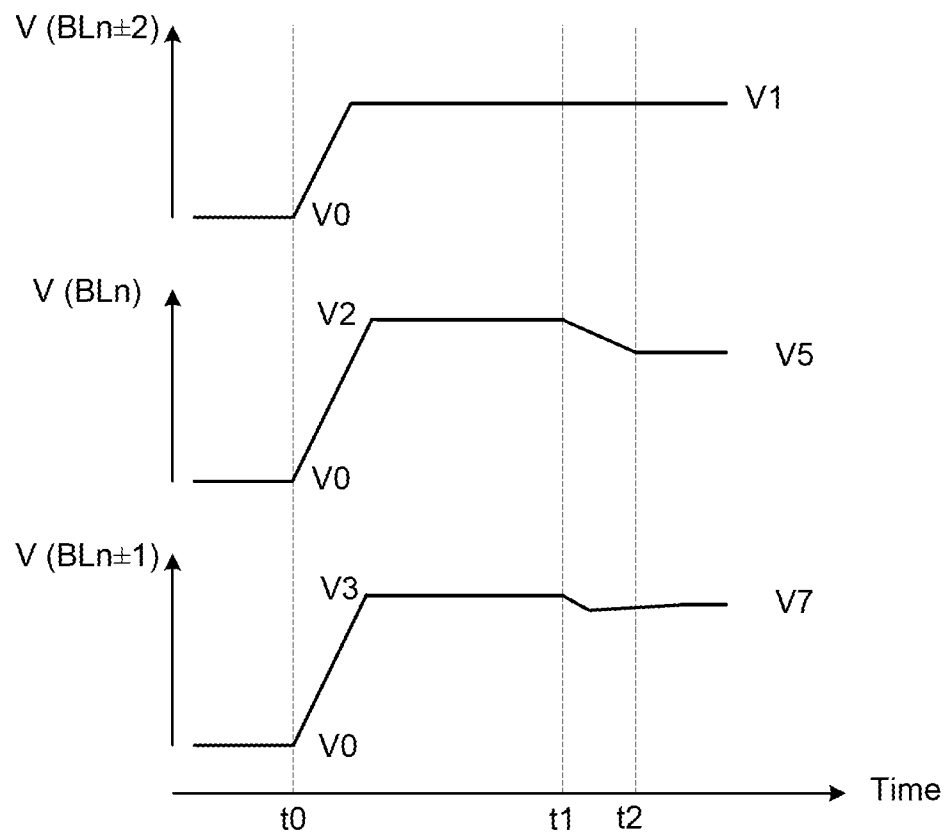
FIGS. 16 and 17 illustrate timing diagrams of an exemplary read operation based on the bit line arrangement shown in FIG. 13 according to various embodiments of the present disclosure.
Figure 17:
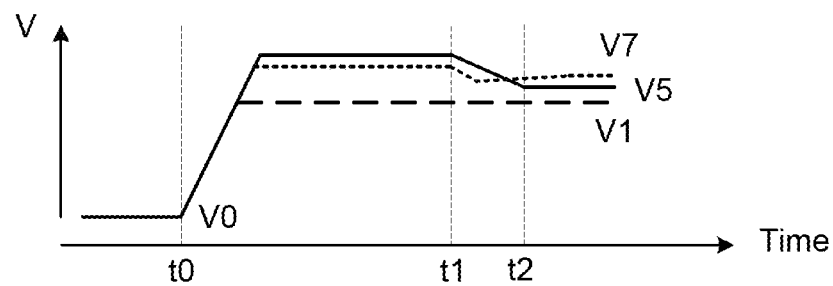

FIGS. 16 and 17 show timing diagrams of an exemplary read operation based on the bit line arrangement 500 shown in FIG. 13 according to various embodiments of the present disclosure. The timing diagrams display schematically voltage traces of the bit lines BLn±2, BLn, and BLn±1 during first and second read operations in some embodiments. Voltage traces of other lines such as word lines are omitted. FIG. 16 shows the voltage traces individually, while FIG. 17 shows the voltage traces superimposed together. In FIG. 17, the voltage traces of the bit lines BLn±2, BLn, and BLn±1 are depicted in a dashed line, a solid line, and a dotted line, respectively. Referring to FIG. 16, before time t0, the voltage of the bit lines is V0 (e.g., a reference potential or the ground). At time t0, the first read operation begins and a voltage V1 is applied to the selected bit line BLn+2 or BLn−2. After the voltage level of the bit line BLn+2 or BLn−2 is charged to V1, a selected memory cell may be accessed and read. Before and after the first read operation is concluded, the selected bit line BLn+2 or BLn−2 is not discharged to a voltage (e.g., a reference potential or the ground), for example, the bit line BLn+2 or BLn−2 may maintain a voltage (e.g., V1 or a value around V1) after the selected memory cell is read at the first read operation and after the second read operation starts.

During the first read operation, a voltage V2 is applied to the unselected bit line BLn at t0. The unselected bit line BLn becomes the selected bit line at the subsequent second read operation that begins at time t1. At time t1, the selected bit line BLn is discharged to a voltage V5. Because the bit line BLn+2 or BLn−2 is not discharged, the parasitic capacitance is reduced compared to the scenario with reference to FIG. 14. The voltage of the selected bit line BLn is settled at time t2. After time t2, a selected memory cell may be accessed and read for the second read operation.

When the selected bit line BLn is charged to V2 at the first read operation, the unselected bit line BLn+1 or BLn−1 is charged to V3. In some embodiments, the voltage V1 is smaller than V3 and the voltage V3 is smaller than V2. At time t1, the voltage level of the unselected bit line BLn+1 or BLn−1 is influenced by the discharge of the bit line BLn, becomes unsettled, and then is lowered to a voltage V7.

Figure 18:
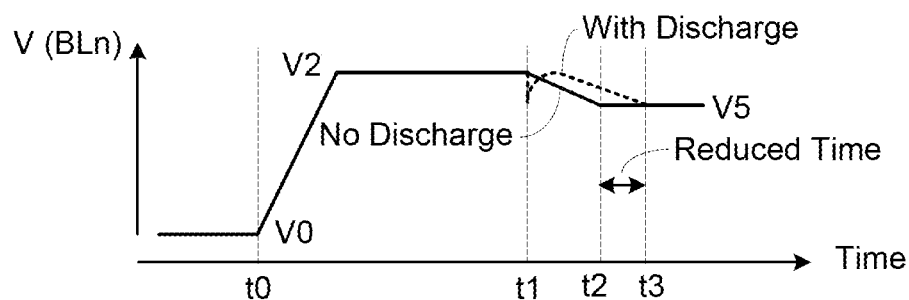
FIG. 18 illustrates a timing diagram of the two exemplary read operations shown in FIGS. 14 and 16 according to various embodiments of the present disclosure.

FIG. 18 shows a timing diagram reflecting the two exemplary read operations shown in FIGS. 14 and 16 according to various embodiments of the present disclosure. The timing diagram displays schematically voltage traces of the bit line BLn at the first and second read operations. The voltage trace of the bit line BLn shown in FIG. 14 is in dotted line, while the voltage trace of the bit line BLn shown in FIG. 16 is in solid line. As shown in FIG. 18, the voltage of the bit line BLn is settled at time t2 when the bit line BLn+2 or BLn−2 is not discharged. However, when the bit line BLn+2 or BLn−2 is discharged after a memory cell is read, the voltage of the bit line BLn is settled at time t3, which is larger than t2. The difference between time t2 and t3 is the reduced time because the bit line BLn+2 or BLn−2 is not discharged, which results in shortened read time of the worst case. As such, the read time of the 3D memory device may be improved.

TABLE 1

| | Iso = 22.54 nA Iso/Icell = 70% | Iso = 25.76 nA Iso/Icell = 80% | Iso = 28.98 nA Iso/Icell = 90% | Iso = 30.59 nA Iso/Icell = 95% |
|---|---|---|---|---|
| Charging Time (BLn ± 2 Discharged) | 13.5 μs | 15.2 μs | 21.2 μs | 29.6 μs |
| Charging Time (BLn ± 2 Not Discharged) | 10.8 μs | 12.0 μs | 16.2 μs | 23.4 μs |

Table 1 shows an example of respective charging time. The data in Table 1 may be calculated based on the bit line arrangement 500. Assuming that the bit line BLn+2 or BLn−2 is the selected bit line at a first read operation, and the bit line BLn is the selected bit line at a subsequent second read operation. Iso is an SO node current of a page buffer circuit. Icell is a memory cell current in a channel between a TSG and a BSG. At a read operation, when Iso and Icell are equal or substantially close to each other, it may be considered that sensing of a memory cell is accurate. As shown in Table 1, when the ratio between Iso and Icell is 70% at the second read operation, the charging time is 10.8 microseconds when the bit line BLn+2 or BLn−2 is not discharged after the first read operation, while the charging time is 13.5 microseconds when the bit line BLn+2 or BLn−2 is discharged after the first read operation. Further, when the ratio between Iso and Icell is 95% at the second read operation, the charging time is 23.4 microseconds when the bit line BLn+2 or BLn−2 is not discharged, while the charging time is 29.6 microseconds when the bit line BLn+2 or BLn−2 is discharged. As such, the comparison results show that the charging time is reduced when the bit line BLn+2 or BLn−2 is not discharged after the first read operation. Hence, the read time of the worst case and thus the read time of the 3D memory device may be improved.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A method for operating a three-dimensional (3D) memory device, comprising:
   performing a first read operation of a first memory cell of a first transistor string, which comprises:
      applying a first bit line voltage to a first bit line connected to the first transistor string,
      applying a word line voltage to a word line connected to the first memory cell,
      performing a sensing operation of the first memory cell, and
      while maintaining a voltage of the first bit line at a certain level being at least more than half voltage level of the first bit line voltage, discharging the word line to complete the first read operation, and
   while still maintaining the voltage of the first bit line at the certain level, performing a second read operation of a second memory cell of a second transistor string.

2. The method according to claim 1, wherein performing the first read operation further comprises:
   applying a first select voltage to a first select line to turn on a first select gate connected to the first transistor string and the first bit line; and
   applying a second select voltage to a second select line to turn on a second select gate connected to the first transistor string and a common source;
   wherein
   performing the sensing operation comprises detecting a data state of the first memory cell.

3. The method according to claim 1, further comprising:
   applying an initial second bit line voltage to a second bit line when applying the first bit line voltage to the first bit line at the first read operation, wherein
while maintaining the voltage of the first bit line at the certain level, the second bit line is settled at a second bit line voltage for performing the second read operation, and the second bit line is connected to the second transistor string through a third select gate.

4. The method according to claim 3, wherein:
the initial second bit line voltage is higher than the first bit line voltage, and the second bit line voltage and the first bit line voltage have a same value or the second bit line voltage and the first bit line voltage have values that are substantially close to each other.

5. The method according to claim 1, wherein:
the first memory cell and the second memory cell are memory cells from a same page of the 3D memory array.

6. The method according to claim 1, wherein:
the second transistor string is adjacent to the first transistor string.

7. The method according to claim 1, wherein:
the second transistor string is adjacent to a middle transistor string, and the middle transistor string is adjacent to the first transistor string.

8. The method according to claim 1, further comprising:
applying a third bit line voltage to a plurality of third bit lines corresponding to a plurality of third transistor strings at the first read operation, the plurality of third transistor strings and the first transistor string each include at least one memory cell from a same page.

9. The method according to claim 1, further comprising:
applying a fourth bit line voltage to a plurality of fourth bit lines corresponding to a plurality of fourth transistor strings at the first read operation, the plurality of fourth transistor strings and the first transistor string each include at least one memory cell from a same row.

10. The method according to claim 1, wherein maintaining the voltage of the first bit line at the certain level comprises:
maintaining the first bit line basically undischarged at the first bit line voltage, or
maintaining the first bit line partly discharged from the first bit line voltage to a voltage more than half voltage level of the first bit line voltage.

11. A three-dimensional (3D) memory device, comprising:
a plurality of memory cells in a 3D memory array;
a page buffer for sensing data state of the plurality of memory cells of the memory array; and
a controller for accessing the plurality of memory cells, wherein the controller is configured to:
perform a first read operation of a first memory cell of a first transistor string of the 3D memory array, which comprises:
applying a first bit line voltage to a first bit line connected to the first transistor string,
applying a word line voltage to a word line connected to the first memory cell,
performing a sensing operation of the first memory cell, and
while maintaining a voltage of the first bit line at a certain level being at least more than half voltage level of the first bit line voltage, discharging the word line to complete the first read operation, and
while still maintaining the voltage of the first bit line at the certain level, perform a second read operation of a second memory cell of a second transistor string of the 3D memory array.

12. The 3D memory device according to claim 11, wherein the controller is further configured to:
apply a first select voltage to a first select line to turn on a first select gate connected to the first transistor string and the first bit line;
apply a second select voltage to a second select line to turn on a second select gate connected to the first transistor string and a common source; and
detect a data state of the first memory cell when performing the sensing operation.

13. The 3D memory device according to claim 11, wherein the controller is further configured to:
apply an initial second bit line voltage to a second bit line when applying the first bit line voltage to the first bit line at the first read operation;
wherein
the second bit line is settled at a second bit line voltage for the second read operation, and
the second bit line is connected to the second transistor string through a third select gate.

14. The 3D memory device according to claim 13, wherein:
the initial second bit line voltage is higher than the first bit line voltage, and the second bit line voltage and the first bit line voltage have a same value or the second bit line voltage and the first bit line voltage have values that are substantially close to each other.

15. The 3D memory device according to claim 11, wherein:
the second transistor string is adjacent to the first transistor string.

16. The 3D memory device according to claim 11, wherein:
the second transistor string is adjacent to a middle transistor string, and the middle transistor string is adjacent to the first transistor string.

17. The 3D memory device according to claim 11, wherein the controller is further configured to:
apply a third bit line voltage to a plurality of third bit lines corresponding to a plurality of third transistor strings of the 3D memory array at the first read operation, the plurality of third transistor strings and the first transistor string each including at least one memory cell from a same page.

18. The 3D memory device according to claim 11, wherein the controller is further configured to:
apply the fourth bit line voltage to a plurality of fourth bit lines corresponding to a plurality of fifth transistor strings of the 3D memory array at the first read operation, the plurality of fourth transistor strings and the first transistor string each include at least one memory cell from a same row.

19. The 3D memory device according to claim 11, wherein the 3D memory array is formed through a layer stack, the layer stack includes a plurality of dielectric layers and a plurality of conductor layers alternately stacked over each other, and the first transistor string and second transistor string extend through the plurality of dielectric layers and the plurality of conductor layers.

20. The 3D memory device according to claim 11, wherein the 3D memory device is 3D NAND memory.

* * * * *